United States Patent [19]
Johnson, Jr. et al.

[11] 3,977,926
[45] Aug. 31, 1976

[54] METHODS FOR TREATING ARTICLES

[75] Inventors: Anderson F. Johnson, Jr., Sinking Spring; Edward L. Stork, Ephrata; Richard H. Winings, St. Lawrence, all of Pa.

[73] Assignee: Western Electric Company, Inc., New York, N.Y.

[22] Filed: Dec. 20, 1974

[21] Appl. No.: 534,918

[52] U.S. Cl. .................... 156/17; 118/416; 134/33; 156/345; 269/37; 427/242
[51] Int. Cl.² .................................. H01L 21/306
[58] Field of Search .............. 156/17, 345; 427/57, 427/240, 242, 347; 118/416, 417; 134/86, 92, 158, 159, 25, 32, 33; 294/87 R; 269/37

[56] References Cited
UNITED STATES PATENTS

| | | | |
|---|---|---|---|
| 3,428,059 | 2/1969 | Wenzel et al. | 134/159 |
| 3,679,517 | 6/1972 | Schulten et al. | 156/345 |
| 3,841,689 | 10/1974 | Hurlbrink | 294/87 R |

*Primary Examiner*—Douglas J. Drummond
*Assistant Examiner*—Jerome W. Massie
*Attorney, Agent, or Firm*—G. W. Houseweart; M. Y. Epstein

[57] ABSTRACT

To eliminate the manual handling of individual articles associated with loading and unloading conventional treating apparatus, a plurality of articles are simultaneously treated in the carriers which are used for batch handling prior to and subsequent to the treating operation. In a disclosed embodiment, wafer-shaped articles are held in mutually spaced substantially parallel relationship in a plurality of slots in a first carrier having an open face through which the wafers can be inserted and removed. The open face of the first carrier is abutted to the open face of an empty second carrier having at least a corresponding plurality of slots, such that the slots of the first carrier are aligned with the slots of the second carrier. The abutted carriers, with the wafers contained therein, are submersed in a treating medium and rotated about an axis running through the abutted faces of the carriers. The speed of rotation is maintained sufficient to produce rolling of the wafers through the axis, back and forth between the carriers.

14 Claims, 5 Drawing Figures

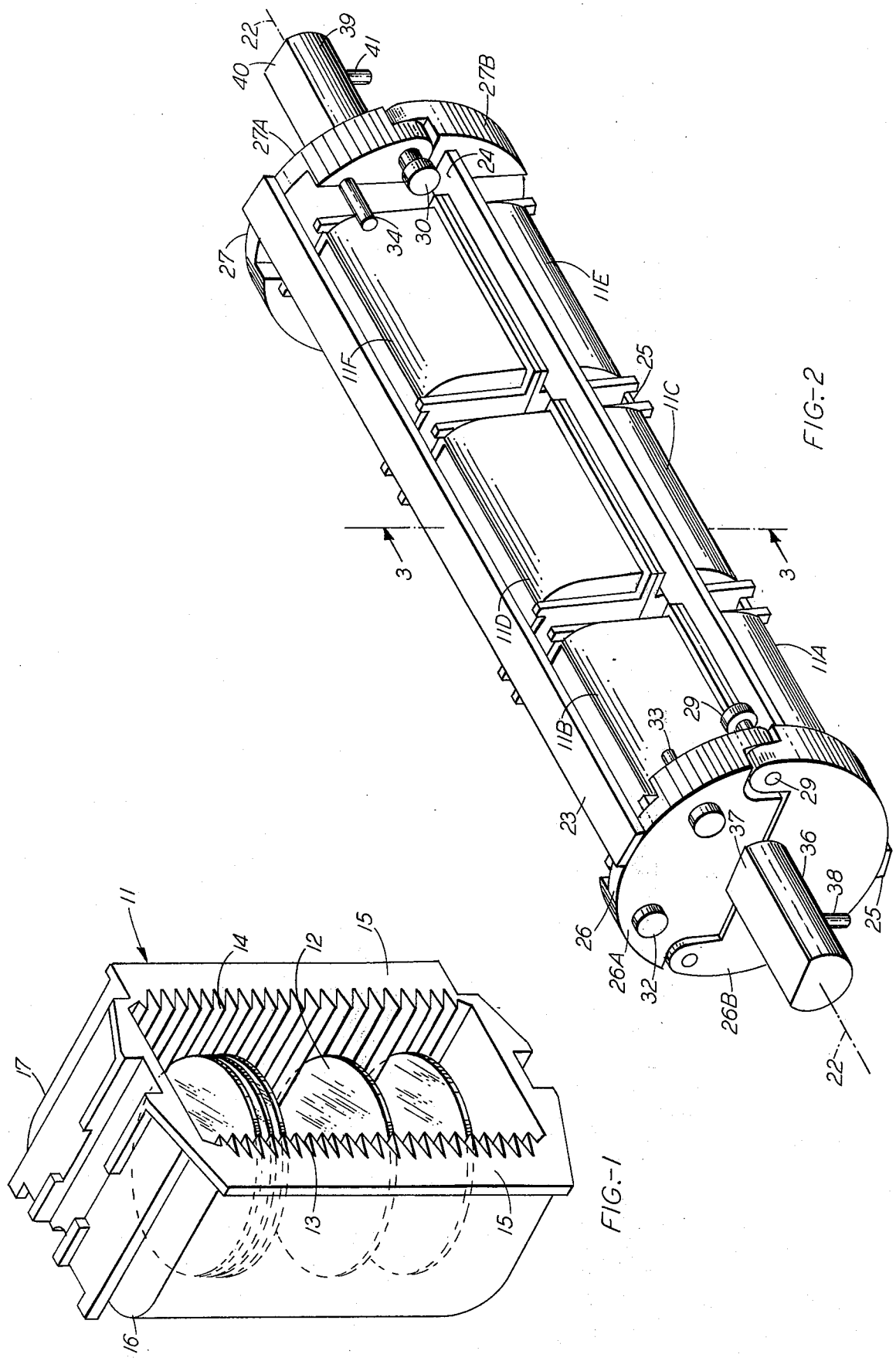

METHODS FOR TREATING ARTICLES

BACKGROUND OF THE INVENTION

1. Field of the Invention

The invention relates to methods and apparatus for treating an article; and, more particularly, for simultaneously etching a plurality of semiconductor wafers.

As is well known, the impact which modern solidstate electronic components such as transistors and integrated circuits have had upon our society is difficult to overestimate. A central factor contributing to the pervasiveness with which such components have become a part of daily life, is the relatively low cost of such components. The low cost is achieved principally because of batch handling techniques which have been developed for fabricating the components. For example, typically hundreds and often thousands of such components are simultaneously fabricated within and upon the surface of a single semiconductor wafer of substantially circular cross-section.

Techniques for batch handling of pluralities of wafers simultaneously also are significant, not only in reducing cost but also in reducing damage to and contamination of wafers which can be incurred during manual handling of individual ones. Presently, it is conventional to handle a plurality of wafers simultaneously in a slotted carrier having an open face through which the wafers can be inserted into the slots and removed therefrom. Extension of such techniques is a primary motivating factor leading to this invention.

2. Description of the Prior Art

It is known to simultaneously etch a plurality of wafers with one in each of a corresponding plurality of slots and to impart a relative movement between the wafers and the etching solution for providing a more uniform etch. See for example, U.S. Pat. No. 3,607,478 issued Sept. 21, 1971 to K. Henninges et al. Henninges et al. teaches holding the wafers in a carrier which is disposed in the bottom of a vessel containing the desired etching solution. The entire vessel is rocked about a central pivot point to impart a rolling motion of each wafer within its respective slot.

Unfortunately, apparatus of the type disclosed by Henninges et al. is such that the wafers are inserted in the slots manually and individually, thus precluding the economic and other advantages of batch handling. Further, the necessity for moving the entire vessel containing the etching solution causes mechanical drive difficulties and is somewhat dangerous, due to the agitation of the acid or similar dangerous chemical which is used for the etching operation.

SUMMARY OF THE INVENTION

In view of the aforementioned and other problems inherent in prior art methods and apparatus for treating articles, it is an object of this invention to provide new and improved methods and apparatus for treating an article.

It is a further object of this invention to provide new and improved methods and apparatus for simultaneously treating a plurality of articles in the same carriers in which they are batch handled prior to and subsequent to the treating operation.

To these and other ends, a method of treating an article in accordance with this invention includes the step of holding the article in a slot in a first carrier which has an open face for insertion and removal of the article. The open face of the first carrier containing the article is positioned adjacent to the open face of an empty second slotted carrier such that the slot of the first carrier is substantially aligned with the slot of the second carrier. With the open faces of the carriers so positioned, the carrier containing the article is placed in a treating medium; and the carriers are moved at a speed and along a path sufficient to permit moving of the article back and forth between the carriers.

In a particular disclosed embodiment, both carriers are placed in the treating medium and are rotated about an axis lying in a plane defined by the abutted open faces of the carriers. The axis is maintained substantially horizontal; and the rotation is maintained such that the articles roll through the axis under the influence of gravity.

More specifically, in a particular disclosed embodiment, a plurality of wafers are held in mutually spaced, substantially parallel relationship in a corresponding plurality of slots in a first carrier having an open face through which the wafers may be inserted and removed. The open face of the first carrier is abutted to an open face of an empty second carrier having at least the corresponding plurality of slots such that the slots of the two carriers are aligned. The carriers and the wafers contained therein are submersed in a treating medium and are rotated about an axis lying in a plane defined by the abutted faces. That axis is maintained substantially horizontal; and the wafers are held in a substantially vertical plane. The carriers are rotated about the axis at a speed of rotation sufficient to permit rolling of the wafers through the axis and back and forth between the carriers.

Apparatus for carrying out the foregoing method steps is disclosed and is considered to be a part of this invention. Such apparatus includes expedients for holding first and second carriers such that openings therein are adjacent with one or more slots therein substantially aligned and for moving the carriers about an axis in a treating medium at a speed and along a path sufficient to permit moving of a contained article back and forth between the carriers.

BRIEF DESCRIPTION OF THE DRAWING

The aforementioned and other features, characteristics, and advantages, and the invention in general, will be better understood from the following more detailed description taken in conjunction with the accompanying drawing in which:

FIG. 1 is an isometric frontal view of a commonly used type of carrier containing wafers;

FIG. 2 is an isometric frontal view of apparatus for holding a plurality of pairs of abutted carriers during a treating operation.

Figure 3C:
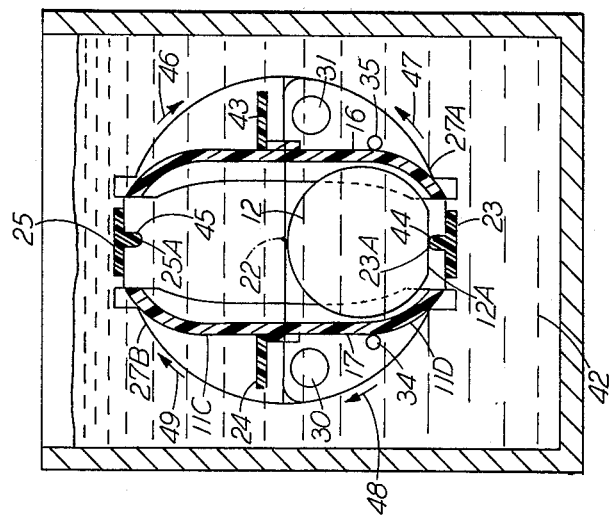
FIGS. 3A–3C are cross-sections taken along line 3—3 of FIG. 2 and assume that the apparatus of FIG. 2 is submersed in a treating medium.

Throughout the figures, reference numerals have been repeated to indicate corresponding features where appropriate.

DETAILED DESCRIPTION

With reference now to the drawing, FIG. 1 shows an isometric frontal view of a type of carrier 11 commonly used in the semiconductor industry for batch handling of wafers 12. Carriers such as carrier 11 are often used in conjunction with air-bearing conveyor mechanisms or similar apparatus. As seen, in a carrier 11, a plurality of wafers 12 are supported at the peripheral portions thereof in mutually spaced substantially parallel relationship. The wafers are supported by a corresponding or greater plurality of generally U-shaped or V-shaped slots 13 and 14 into which the peripheral portions of the wafers slide and by which the wafers are held. It will be appreciated that for clarity of illustration only a few wafers 12 are shown to be in carrier 11 in FIG. 1. Of course, in practice, carrier 11 will often contain a wafer 12 in each slot.

A carrier such as carrier 11, typically includes an open front face 15 through which wafers are inserted into and removed from the slots 13 and 14 by sliding. The back face of carrier 11, not visible in the illustration of FIG. 1, typically is also open except for suitable detents such as illustrated by curved portions 16 and 17 to prevent the wafers from sliding out through the back face of the carrier.

It has been conventional to etch semiconductor wafers of the type such as wafers 12 in FIG. 1 by manually inserting the wafers individually into partitions in a holder and then moving the holder in a fluid treating medium to effect relative movement between the wafers and the medium. In this manner, the treating fluid is swept over the major faces of the wafers to avoid a depletion of the treating fluid at the wafer surfaces, all of which is well known to workers skilled in the semiconductor art.

To avoid the need for removing wafers from carriers such as carrier 11 in which the wafers are processed, handled, and transported during and between operations prior to and subsequent to the particular treating operation, the following method can be employed. The open face 15 (FIG. 1) of a carrier containing a plurality of wafers is abutted to the open face of an empty second carrier of like kind having a corresponding of greater plurality of slots, with the slots of the two carriers mutually aligned. The abutted carriers are submersed into a treating fluid and rotated about an axis running through the abutted open faces of the carriers. If the speed of rotation is maintained sufficiently slow, the wafers will roll back and forth across the submersed axis and a desired treatment can be achieved.

Figure 3B:
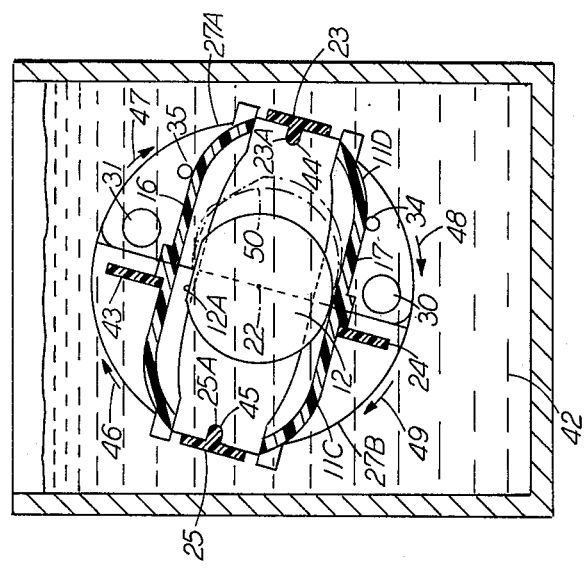
Figure 3A:
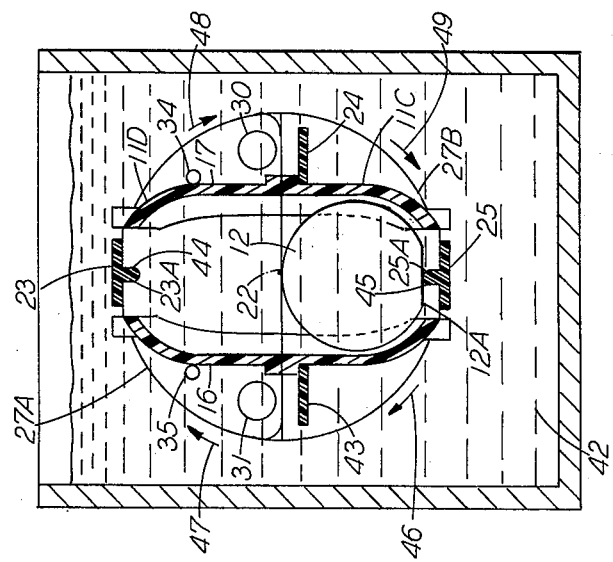

More specifically, FIG. 2 shows an isometric frontal view of apparatus 21 for holding a plurality of pairs of abutted carriers containing wafers and rotating them as described about an axis 22 during the treating operation. As seen, apparatus 21 includes a plurality of rails or bars 23–25 attached to a pair of opposed end members 26 and 27 for holding a plurality of abutted carriers 11A–11F together during the treating operation. End members 26 and 27 may be identical, with each being comprised of detachable halves 26A, 26B, 27A and 27B held together by pins 28–31. Pin 31, in end member 27, is not visible in FIG. 2 but is shown in FIGS. 3A–3C. Inasmuch as the halves are detachable by pins, they may be separated to facilitate introduction of the pairs of carriers into the apparatus.

As also seen in FIG. 2, each end member 26A and 27A includes stop pins 32–34 for further engaging the curved detent portions of the carriers for holding them securely in position during the treating operation. A fourth stop pin 35, in end member 27A, is not visible in FIG. 2, but is shown in FIGS. 3A–3C.

To facilitate coupling apparatus 21 to motorized means (not shown) or other means (not shown) for moving apparatus 21 in a treating medium, end member 26B has attached thereto a short shaft member 36 having a flat portion 37 and a key 38. End member 27B similarly includes a short shaft member 39 having a flat portion 40 and a key 41.

Of course, the material of carriers 11 and 11A–11F, and of apparatus 21 advantageously is selected to be resistant to the substance involved in the contemplated treating operation. For example, for a treating operation such as etching which involves corrosive substances, the material of carriers 11 and 11A–11F and of apparatus 21 advantageously is selected to be resistant to attack by the etchant. Carriers 11 and 11A–11F typically may be of an inert polymer such as Teflon or polyvinylchloride (PVC). PVC is presently preferred for apparatus 21 as it has greater rigidity and strength for a given set of dimensions.

Of course, it will be appreciated that the apparatus of FIG. 2 is only illustrative of apparatus suitable for carrying out the principles of this invention and may take a wide variety of shapes and forms and may be adapted for holding a lesser or greater plurality of pairs of carriers than is actually depicted in FIG. 2.

With reference now to FIGS. 3A–3C, there are shown cross-sectional views of the apparatus of FIG. 2 which are taken along line 3—3 of FIG. 2 and which assume that the apparatus of FIG. 2 is submersed in a suitable treating medium 42, such as a desired etching solution. By way of background, the treating method and apparatus of this invention advantageously is used in an operation which is referred to by those in the art as chemical lapping. Chemical lapping is that operation which is employed to etch damaged surface portions from wafers after the wafers have been sawed from the approximately right circular cylindrical ingot form in which monocrystalline semiconductor material typically is originally grown. A typical etching solution which is employed for chemical lapping may include about one part by volume hydrofluroic acid, four parts by volume nitric acid, and two parts by volume acetic acid.

As seen in FIG. 3A, the abutted carriers 11C and 11D are submersed in etching solution 42 such that carrier 11C is in the downward direction and therefore contains the wafers 12. A fourth rail 43, for holding the carriers together, is visible in the view of FIG. 3A, although it was not visible and therefore was not given a reference numeral in the view of FIG. 2. Also shown in FIGS. 3A–3C are splines 23A and 25A, depending from members 23 and 25, respectively. Splines 23A and 25A engage recessed portions 44 and 45 in carriers 11D and 11C, respectively, and thus contribute to holding the carriers securely in position during the treating operation.

In FIG. 3, arrows 46–49 indicate the direction about which carriers 11C and 11D will be assumed to rotate about axis 22 for the purpose of discussion. Of course, it is of no consequence which direction the carriers actually are rotated about axis 22.

FIG. 3B shows the structure of FIG. 3A as it appears after a rotation of approximately 105° has taken place so that the slots of carrier 11C are inclined toward carrier 11D. At this instant in time, wafers 12 are rolling, as indicated by broken lines 50 toward an eventual detent at detent portions 16 and 17 adjacent the back face of carrier 11D. As is particularly evident in FIG. 3B, semiconductor wafers typically include a flat chord, designated 12A in FIG. 3B, which is used during processing to orient the wafers in a particular direction with respect to the crystalographic structure of the monocrystalline material of which the wafer is comprised. Such a chord or flat portion is of no deleterious consequence to the rolling motion inasmuch as it typically in practice comprises only a relatively few degrees of arc.

With reference now to FIG. 3C, there is shown the structure of FIGS. 3A and 3B after rotation has proceeded 180°. As is readily seen, wafers 12 now have rolled under the influence of gravity along the slots and into carrier 11D where they are held in contact with detent portions 16 and 17. Of course, it will be apparent at this point, that subsequent rotation through another 180° will cause the wafers to roll back across submersed axis 22 into carrier 11C. Repeated rotation of the carriers about axis 22, of course, causes a repetition of the above-described rolling of wafers 12 back and forth between the carriers.

Advantageous speeds of rotation are bounded on the upper side by the centrifugal force which would be developed and which could prevent the desired rolling of the wafers back and forth between the carriers. A desire for movement of the wafers relative to the treating medium may place a lower bound on advantageous speeds of rotation. In practice a speed of 35 revolutions per minute has been used successfully; and it is expected that a range of at least 5 to 50 revolutions per minute can be used.

Because of the mechanical agitation which results when the wafers roll along V-shaped slots, such as slots 13 and 14 in FIG. 1, the edges of the wafers tend to etch somewhat faster than other portions of the wafers. Such accelerated etching of the edges tends to produce a slight rounding of those edges. This slight rounding is often desirable in chemically lapping because a subsequent growth of epitaxial layers on the wafers with slightly rounded edges tends to avoid any build-up of ridges in such layers at the edges of the wafers.

It is expected that this rounding effect can be adjusted and controlled by corresponding adjustment and control of speed of rotation and the angle subtended by the V-shaped slots. With silicon wafers of approximately 2 inch diameter and 0.020 inch thickness held in V-shaped slots subtending an angle of about 10°, a rotating speed of about 35 revolutions per minute in the above-described etching formulation has produced a useful rounding effect to avoid edge ridges during subsequent epitaxial growth. Also, with these given parameters, a control over uniformity of wafer thickness superior to that of prior known etching apparatus was achieved. More specifically, a wafer thickness uniformity of better than ½ mil (0.0005 inch) over the two inch wafer was achieved.

At this point it is believed the principles of this invention have been described in sufficient detail to enable one skilled in the art to practice the invention. Although the invention has been described in part by making detailed reference to a specific embodiment, such detail is intended to be and will be understood to be instructive rather than restrictive. It will be appreciated by those skilled in the art that many variations may be made in the structure and in the modes of operation without departing from the spirit and scope of the invention as disclosed in the foregoing teachings.

For example, it will be appreciated that the invention may be used with any fluid treating medium, be it a liquid or a gas, provided that suitable adaptation is made in the carriers to enable the medium to flow through the carriers and suitably come in contact with the article or articles to be treated. Of course, the invention is not limited to etching or chemical lapping, but may also be used for other chemical or mechanical or combined chemical and mechanical treating applications such as, but not limited to, electroplating, electroless plating, anodizing, polishing, or the like, wherein an interaction between an article and a treating medium is desired.

Further, of course, movement of the abutted carriers need not be restricted to simple rotation about a submersed horizontal axis, but may for example, include eccentric rotation about an axis or more generalized movement through a treating medium in arcuate or other more complex paths.

Still further, of course, the carriers need not actually be abutted into physical contiguity. Rather, the carriers need only be positioned with open faces sufficiently adjacent each other, perhaps with a slotted spacer member therebetween, to enable movement of the articles back and forth between the carriers.

Still further, of course, the invention can be practiced not only by placing identical carriers adjacent to each other, but may also be practiced by placing the face of a first slotted carrier containing one or more articles adjacent any suitable slotted or partitioned member such that the slots are sufficiently aligned to permit movement of the articles back and forth between the carrier and the member. For example, carriers 11B, 11D, and/or 11F in FIG. 2 may as well have been a slotted member built into apparatus 21 rather than portable, general purpose carriers. Throughout this disclosure and in the claims, the term "carrier" is intended to be interpreted sufficiently broadly to cover all such variations and modifications, all of which are considered to be within the spirit and scope of this invention.

Still further, of course, it will be appreciated that the invention is not limited to treating wafer-like articles of circular outline, but may be adapted for treating virtually any article having a curvilinear surface which will enable the article to move back and forth from one carrier to another.

Still further, of course, it will be appreciated that the invention is not limited to having articles rolling back and forth between carriers under the influence of gravity. Rather, for example, if the articles are magnetically susceptible, they may be forced to move back and forth between carriers under the influence of a magnetic field, in which case, of course, the axis of movement need not have a horizontal component.

Still further, of course, it will be appreciated that a great variety of shapes and types and sizes of carriers may be employed, all within the generic spirit and and scope of the above-described invention.

What is claimed is:

1. A method of treating an article comprising the steps of:
   holding the article by only peripheral portions thereof in a slot in a first carrier used for conveying the article to and from the article treating workplace, the carrier having an opening for insertion and removal of the article;
   positioning the opening of the first carrier adjacent to the opening of an empty second slotted carrier such that the slot of the first carrier is substantially aligned with the slot of the second carrier, the two slots providing an elongated enclosure for confining and treating the article;

immersing at least one of the carriers in a treating medium; and moving the carriers at a speed and along a path to cause rotational and translational movement of the article back and forth between the carriers and through the treating medium.

2. A method as recited in claim 1 wherein the moving step is such that the article moves by rolling.

3. A method as recited in claim 2 wherein the rolling is such that the article remains in the treating medium during the moving step.

4. A method as recited in claim 1 wherein both carriers are submersed and are moved about a submersed axis.

5. A method as recited in claim 4 wherein the submersed axis is coincident with the abutted openings of the carriers.

6. A method as recited in claim 5 wherein the axis is submersed so as to be substantially horizontal and the carriers are rotated about the submersed axis such that the article roll through the submersed axis.

7. A method as recited in claim 1 wherein a plurality of articles are held in mutually spaced substantially parallel relationship in a corresponding plurality of slots in the first carrier; and the second carrier includes at least the corresponding plurality of slots.

8. A method as recited in claim 7 wherein the carriers are abutted; and the carriers and articles contained therein are submersed in the treating medium such that the articles are held in a substantially vertical plane.

9. A method as recited in claim 8 wherein the submersed carriers are rotated about a submersed horizontal axis lying in a plane defined by the abutted openings of the carriers.

10. A method as recited in claim 9 wherein the carriers are rotated such that the articles roll through the submersed horizontal axis.

11. A method as recited in claim 8 wherein the submersed carriers are moved eccentrically about a submersed axis.

12. A method of treating semiconductor wafers comprising the steps of:

holding a plurality of wafers by only peripheral portions thereof in mutually spaced substantially parallel relationship in a corresponding plurality of slots in a first carrier used for conveying the wafers to and from the treating workplace, the carrier having an open face for insertion and removal of the wafers;

abutting the open face of the first carrier to the open face of an empty second carrier having at least the corresponding plurality of slots such that the slots of the first carrier are substantially aligned with the slots of the second carrier, each pair of aligned slots providing an elongated enclosure for confining and treating the articles;

submersing the carriers and wafers contained therein in a treating medium such that an axis lying in a plane defined by the abutted faces is substantially horizontal and the wafers are held in a vertical plane; and rotating the submersed carriers about said axis at a speed of rotation sufficient to cause rotational and translational movement of the wafers through said axis and back and forth between the carriers.

13. A method as recited in claim 12 wherein the rotating step is such that the movement of the wafers is a rolling motion.

14. A method as recited in claim 12 wherein the treating medium is an etching solution.

* * * * *